(12) United States Patent
Xie

(10) Patent No.: US 9,977,248 B1
(45) Date of Patent: May 22, 2018

(54) AUGMENTED REALITY DISPLAY SYSTEM

(71) Applicant: PhantaField, Inc., Goleta, CA (US)

(72) Inventor: Xuejun Xie, Goleta, CA (US)

(73) Assignee: PhantaField, Inc., Goleta, CA (US)

( * ) Notice: Subject to any disclaimer, the term of this patent is extended or adjusted under 35 U.S.C. 154(b) by 0 days. days.

(21) Appl. No.: 15/849,044

(22) Filed: Dec. 20, 2017

Related U.S. Application Data

(63) Continuation-in-part of application No. 15/847,295, filed on Dec. 19, 2017.

(60) Provisional application No. 62/437,146, filed on Dec. 21, 2016.

(51) Int. Cl.
| | |
|---|---|
| G02B 27/01 | (2006.01) |
| G02B 3/00 | (2006.01) |
| G02B 5/20 | (2006.01) |
| H01L 27/15 | (2006.01) |
| G09G 3/32 | (2016.01) |
| F21V 8/00 | (2006.01) |
| G01S 17/89 | (2006.01) |
| H01L 33/32 | (2010.01) |
| G06K 9/00 | (2006.01) |

(52) U.S. Cl.
CPC ....... *G02B 27/0172* (2013.01); *G02B 3/0037* (2013.01); *G02B 5/208* (2013.01); *G06K 9/00604* (2013.01); *G09G 3/32* (2013.01); *H01L 27/156* (2013.01); *H01L 33/32* (2013.01); *G01S 17/89* (2013.01); *G02B 6/0038* (2013.01); *G02B 6/0055* (2013.01); *G02B 2027/014* (2013.01); *G02B 2027/0138* (2013.01); *G02B 2027/0178* (2013.01)

(58) Field of Classification Search
CPC .......................... G02B 27/01–27/0189; G02B 2027/0105–2027/0198
See application file for complete search history.

(56) References Cited

U.S. PATENT DOCUMENTS

| | | | |
|---|---|---|---|
| 8,189,263 B1 | 5/2012 | Wang et al. | |
| 8,582,209 B1 * | 11/2013 | Amirparviz | G02B 3/0056 359/630 |
| 9,274,338 B2 | 3/2016 | Robbins et al. | |
| 9,310,610 B2 | 4/2016 | Border | |
| 2010/0258174 A1 * | 10/2010 | Ghebrebrhan | G02B 1/115 136/256 |
| 2011/0100408 A1 * | 5/2011 | Kushch | C23C 14/20 136/205 |

(Continued)

FOREIGN PATENT DOCUMENTS

EP    1485747 B1    8/2017

*Primary Examiner* — Patrick F Marinelli
(74) *Attorney, Agent, or Firm* — SoCal IP Law Group LLP; John E. Gunther; Steven C. Sereboff

(57) ABSTRACT

There is disclosed a transparent light field display device including a transparent substrate, an array of light-emitting picture elements formed on the transparent substrate, and a sparse microlens array formed over the array of light-emitting picture elements. The sparse microlens array includes a plurality of lens elements with spaces between adjacent lens elements. When the transparent light field display device is disposed with the sparse microlens array proximate a viewer's eye, the spaces between adjacent lens elements allow the viewer to see objects beyond the transparent light field display device.

20 Claims, 14 Drawing Sheets

(56) References Cited

U.S. PATENT DOCUMENTS

| | | | |
|---|---|---|---|
| 2011/0261183 A1* | 10/2011 | Ma | A61B 90/361 348/77 |
| 2012/0002127 A1* | 1/2012 | Yamazaki | G09G 3/3677 349/43 |
| 2012/0056980 A1* | 3/2012 | Gay | G06T 15/205 348/42 |
| 2013/0241907 A1* | 9/2013 | Amirparviz | G02B 27/0093 345/207 |
| 2014/0168783 A1 | 6/2014 | Luebke et al. | |
| 2014/0313484 A1* | 10/2014 | Bogaert | A61B 3/0025 351/211 |
| 2014/0353468 A1* | 12/2014 | Choi | H01L 27/1463 250/208.1 |
| 2014/0376097 A1* | 12/2014 | Yamashita | G02B 3/0018 359/619 |
| 2015/0089823 A1* | 4/2015 | Garrone | G01C 17/38 33/303 |
| 2015/0153572 A1* | 6/2015 | Miao | G02B 27/017 345/8 |
| 2015/0228230 A1* | 8/2015 | Yamazaki | G02F 1/13318 345/206 |
| 2015/0331285 A1* | 11/2015 | Bibl | G02F 1/133603 362/84 |
| 2016/0041663 A1* | 2/2016 | Chen | G06F 3/0412 345/174 |
| 2016/0109705 A1 | 4/2016 | Schowengerdt | |
| 2016/0274357 A1* | 9/2016 | Joo | G02B 27/017 |
| 2016/0307939 A1* | 10/2016 | Wang | H01L 27/1443 |
| 2016/0314729 A1* | 10/2016 | Gutierrez | G09G 3/02 |
| 2016/0320615 A1* | 11/2016 | Nakamura | G02B 3/0043 |
| 2016/0363709 A1* | 12/2016 | Lee | G02F 1/133615 |
| 2017/0012664 A1* | 1/2017 | Casey | G06F 17/141 |
| 2017/0154909 A1* | 6/2017 | Ishizu | H01L 27/14612 |
| 2017/0235028 A1* | 8/2017 | Uchida | G02B 5/0268 359/599 |
| 2017/0236463 A1* | 8/2017 | Chi | G02B 27/141 345/694 |
| 2017/0243772 A1* | 8/2017 | Oh | H01L 21/67132 |
| 2017/0246900 A1* | 8/2017 | Cote | G02B 3/0056 |
| 2017/0250168 A1* | 8/2017 | Do | G09G 3/3426 |
| 2017/0255011 A1* | 9/2017 | Son | G02B 5/3025 |
| 2017/0269367 A1* | 9/2017 | Qin | G02B 27/0172 |
| 2017/0288093 A1* | 10/2017 | Cha | H01L 25/0756 |
| 2017/0344337 A1* | 11/2017 | Kabatek | G06F 3/165 |
| 2018/0004013 A1* | 1/2018 | Vasiliev | G02C 7/101 |

\* cited by examiner

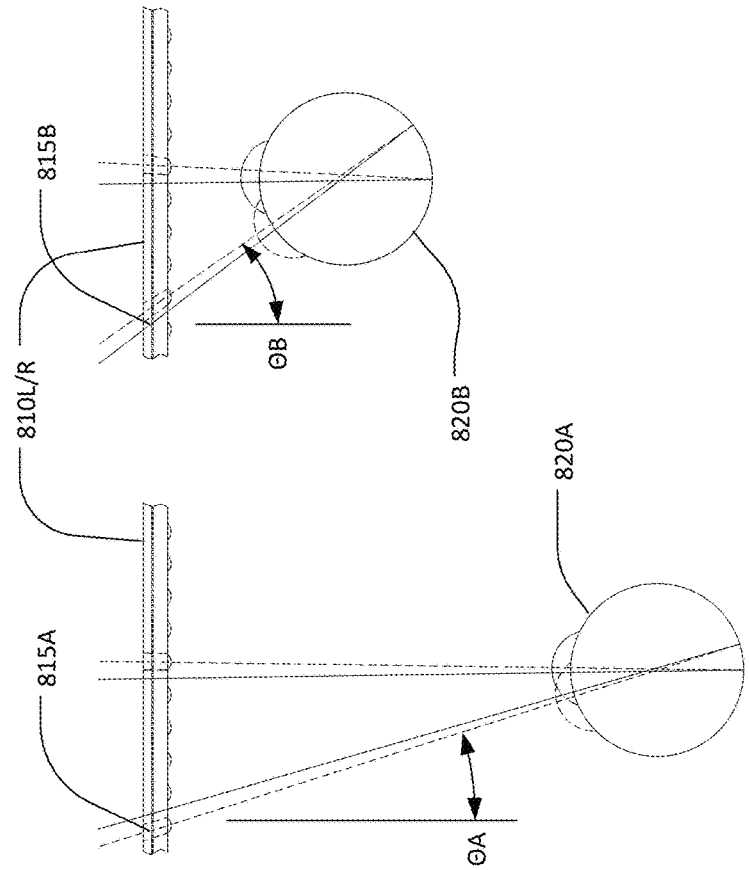
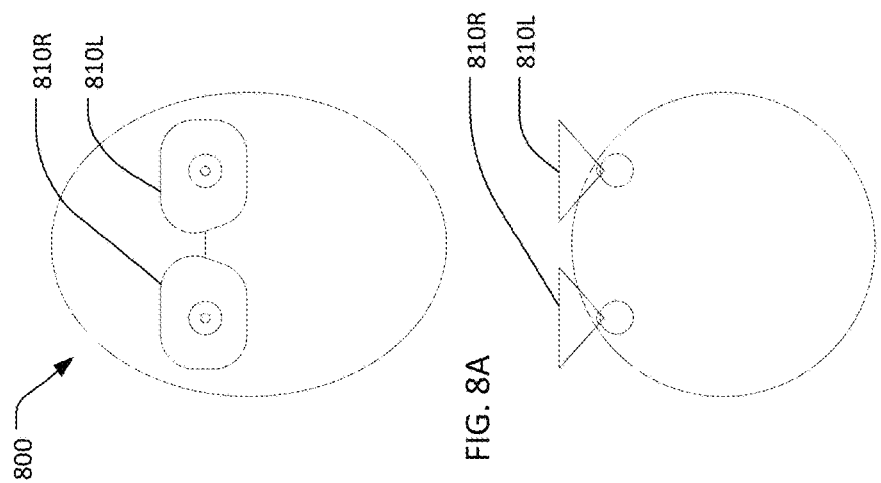

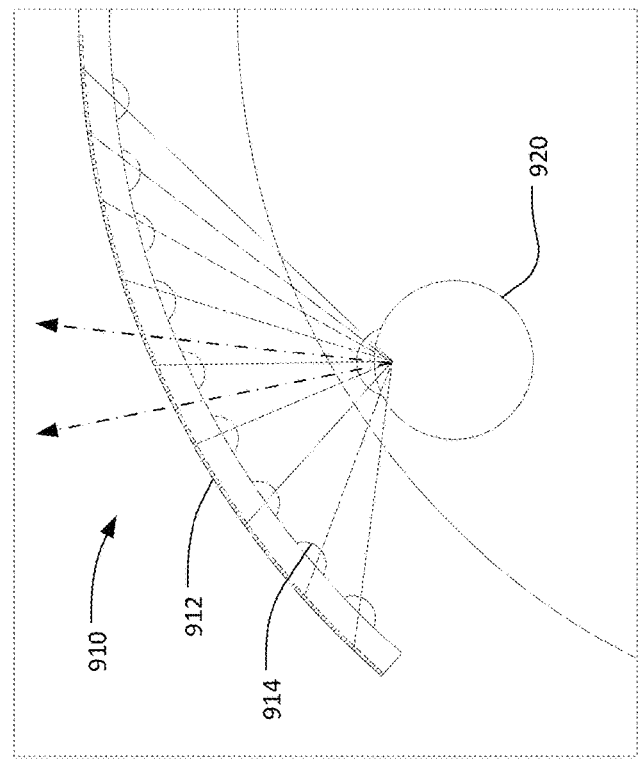
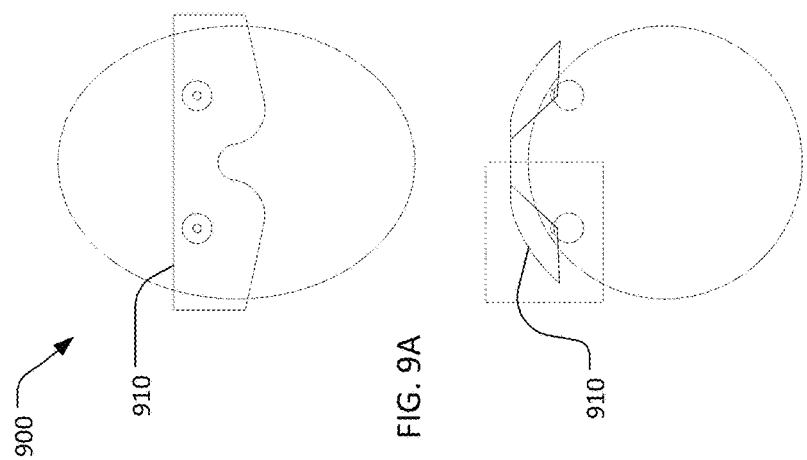

AUGMENTED REALITY DISPLAY SYSTEM

RELATED APPLICATION INFORMATION

This patent is a continuation-in-part of application Ser. No. 15/847,295, filed Dec. 19, 2017, titled AUGMENTED REALITY DISPLAY SYSTEM, which claims priority from provisional patent application 62/437,146, filed 21 Dec. 2016, titled PORTABLE LIGHT FIELD NEAR EYE SEE-THROUGH DISPLAY AND CAMERA, which are incorporated herein by reference.

NOTICE OF COPYRIGHTS AND TRADE DRESS

A portion of the disclosure of this patent document contains material which is subject to copyright protection. This patent document may show and/or describe matter which is or may become trade dress of the owner. The copyright and trade dress owner has no objection to the facsimile reproduction by anyone of the patent disclosure as it appears in the Patent and Trademark Office patent files or records, but otherwise reserves all copyright and trade dress rights whatsoever.

BACKGROUND

Field

This patent relates to virtual and augmented reality display systems. More specifically, the present invention is a method and apparatus for a portable light field near eye see-through display and camera.

Description of the Related Art

The revolution of personal electronic devices has gone through personal computer, laptop, and mobile smart phone, with the trend of the devices getting smaller and the screens getting more pixels. People are creating and receiving more information with more portable devices. A next step in the evolution of personal electronic devices may be head-mounted devices with see-through displays to create images in front of the wearer's eyes and cameras to record the images. One proposed solution is using a waveguide and lens to project the images from a micro-display into the wearer's eye or eyes, with a separate camera to record the scenes. This configuration can only create and record the images in single focal plane, and the optical losses render the image invisible under bright ambient light. Human eyes sense the world in different focal planes or light fields. An image presented in a single fixed focal plane may not be perceived as a realistic three-dimensional object. Further presenting images in a single fixed focal plane for an extended time period can cause accommodation conflict, which may induce myopia and sickness.

Light field display systems can be divided into two categories: multi-focal plane systems and microlens array systems. The former usually contain several layers of image projection or recording layers to create or record images in different focal planes, or switch between different focal planes with a variable lens. The light field image quality depends on the number of the focal planes. Multiple focal plane optical systems are increasingly bulky as the number of focal planes increase. Variable lens systems are bulky and not fast enough to switch through many layers of focal planes.

Microlens array light field display systems typically dispose a microlens array between the viewer's eye and a high resolution microdisplay. Similarly, a microlens light field camera disposes a microlens array between the scene being recorded and a high resolution photodetector array. Each microlens in the microlens array typically covers several pixels to project or record light in different direction to create or record the light field.

Several factors currently limit the applications of microlens light field displays. First, the light field display image quality depends on the size of the pixel. Current liquid crystal and organic light emitting diode microdisplay technology cannot create small enough pixels to generate a satisfactory light field display. Second, microlens arrays inherently redirect transmitted light such that a wearer cannot see an outside scene through a display or camera covered with a microlens array. Third, all currently available microdisplays are fabricated on non-transparent silicon substrates. Thus directly-viewed microlens light field displays are currently limited to virtually reality applications in which the viewer does not need to see the outside scene. Alternatively, microlens light field displays may be indirectly viewed via an optical system that projects an image from the light field display into the viewer's eye(s). Further, light field display systems should create or record large amount of information, which require large computation power and storage space. Current wearable display devices have limited battery, computation power, and storage space. This limits the application and user experience of the head mounted light field display device.

DESCRIPTION OF THE DRAWINGS

FIGS. 8A and 8B are schematic front and top views of a user wearing a system-on-lens (SOL) device.

FIG. 8C is a schematic top view of a system on lens devices for two different wearer eye positions.

FIGS. 9A and 9B are schematic front and top views of a user wearing another system-on-lens (SOL) device.

FIG. 9C is an expanded schematic top view of a system on lens devices of FIGS. 9A and 9B.

Throughout this description, elements appearing in figures are assigned three-digit reference designators, where the most significant digit is the figure number where the element is introduced, and the two least significant digits are specific to the element. An element that is not described in conjunction with a figure may be presumed to have the same characteristics and function as a previously-described element having the same reference designator.

DETAILED DESCRIPTION

Description of Apparatus

Figure 1:
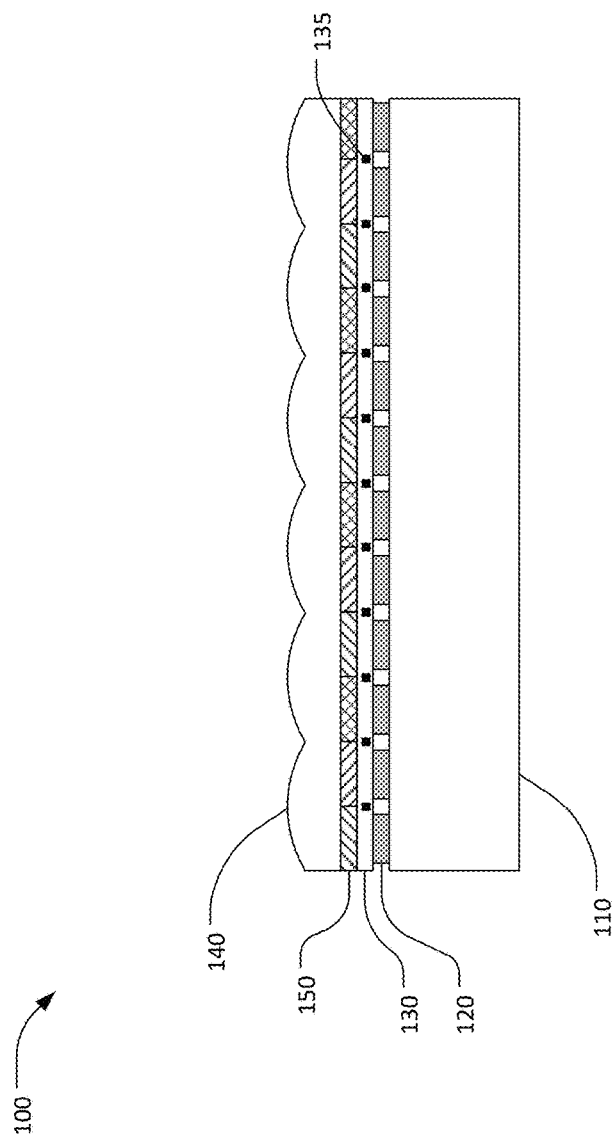
FIG. 1 is a schematic cross-sectional view of a microlens light field display device.

FIG. 1 is a schematic cross-sectional view of a microlens light field display 100. The microlens light field display 100 includes a transparent substrate 110, an array of light emitting elements 120, drive circuits 130, and a microlens array 140. In this context, the term "array" means "a group of elements forming a complete unit." The elements in each array may be, but are not necessarily, arranged in rows and columns. The elements in each array may be arranged in some other manner, including pseudo-randomly positioned. Each array may be dense or sparse, where "sparse" has its normal meaning of "having spaces between the component elements." Conversely, a "dense" array may be densely populated with little or no space between component elements. Some embodiments of the microlens light field display 100 may also include an array of wavelength conversion elements 150.

Throughout the drawings, the number of elements in any array is greatly reduced, and the size of the elements greatly enlarged, for ease of presentation. The actual size of elements maybe a small as a few microns for the array of light emitting elements 120 and tens of microns for the microlens array. The number of elements may be very large (e.g. millions) in each of the arrays.

The substrate 110 may be the substrate upon which the array of light emitting elements 120 is fabricated. For example, the array of light emitting elements 120 may be Gallium Nitride (GaN) light emitting diodes (LEDs) fabricated on a planar substrate 110 such as a sapphire or GaN wafer. Alternatively, the array of light emitting elements 120 may be fabricated upon a different, possibly opaque, substrate and subsequently transferred to the transparent substrate 110. In this case, the transparent substrate 110 may be any suitable material such as polycarbonate, acrylic, or other plastic material, glass, or other transparent material. Further, when the array of light emitting elements 120 is transferred to the transparent substrate 110, the substrate 110 may be planar or a portion of a cylinder. The term "cylinder" means "a surface consisting of all the points on all the lines which are parallel to a given line and which pass through a fixed plane curve in a plane not parallel to the given line," and is not limited to a right circular cylinder. A method for transferring a microlens light field display to a cylindrical substrate with be described subsequently.

The array of light emitting element 120 may be composed of GaN LEDs, each of which may include a GaN multiple quantum well structure sandwiched between p-type and n-type GaN layers. The microlens light field display 100 is not limited to GaN LEDs. The array of light emitting elements may be organic LEDs, quantum dot LEDs, LEDs formed in one or more inorganic semiconductor materials other than, or in addition to, GaN, or other types of light emitting elements.

The drive circuits 130 includes a respective control circuit to control the current flow through each of the array of light emitting elements 120. Each of the control circuits includes at least one transistor and may include multiple transistors and other components such as capacitors and resistors. The drive circuits 130 may be fabricated as a multilayer structure (not shown) including a semiconductor layer, one or more conductor layers, one or more light blocking layers, and one or more insulator layers that are appropriately patterned and processed to create the controls circuits. For example, the drive circuits 130 may be fabricated on a silicon-on-insulator (SOI) wafer including an epitaxial silicon film separated from a silicon substrate by an intervening insulator layer. Once fabricated, the drive circuits 130 can be separated from the silicon substrate and bonded/connected to the array of light emitting elements 120. A process for transferring drive circuits from an SOI wafer will be described subsequently. Alternatively, the drive circuits 130 may be fabricated in situ in a semiconductor film on top of the array of light emitting elements 120. The semiconductor film may be, for example, a single crystal silicon film transferred from an SOI wafer or a thin film semiconductor, such as Indium Gallium Zinc Oxide (IGZO), Molybdenum Sulfide (MoS2), or Tungsten Selenide (WSe2), deposited or transferred onto the array of light emitting elements 120. Alternatively, the drive circuits 130 may be fabricated in situ in the GaN region between GaN LEDs.

Image sensor elements 135 may be interleaved between the elements of the array of light emitting elements 120. The image sensor elements may be formed in the same semiconductor material used for the light emitting elements 120, or may be formed in the semiconductor film used for the drive circuits 130. For example, when the drive circuits 130 are formed in a single crystal silicon film, the image sensing elements (e.g. photodiodes or phototransistors) and the necessary readout circuitry may also be formed in the silicon film. The image sensor elements 135 and the microlens array 140 constitute a light field camera directed at the viewer's eye. This camera may be used for iris recognition for viewer authentication and/or to determine the viewer's eye position by detecting light reflected from the viewer's eye. The number of image sensor elements may be less than, the same as, or greater than the number of elements in the array of light emitting elements 120.

When the array of light emitting elements 120 is composed of GaN LEDs, an array of wavelength conversion elements 150 may be used to convert the blue or violet emission from the GaN LEDs into one or more visible colors. Each element in the array of wavelength conversion elements is a fluorescent material that absorbs blue or violet radiation from a corresponding element of the array of light emitting elements 120, and emits one of the three primary colors. In this context, a "fluorescent material" is a material that emits visible light in response to absorption of radiation from another source. Fluorescent materials include phosphors, fluorescent dyes, fluorescent polymers, fluorescent quantum dots, and other materials. The array of wavelength conversion elements 150 may include three different fluorescent materials interleaved to form red/green/blue (RGB) pixels to provide a full color display. The fluorescent material(s) may be deposited over the drive circuits 130 by spin coating or other deposition process and then patterned photolithographically.

The array of light emitting elements 120, the drive circuits 130, the image sensor elements 135, and the array of wave conversion elements 150 (when present) are transparent. This, however, does not require uniform transparency across the area of the transparent light field display device 100. Specific elements (e.g. metal conductors within the drive circuits) may be opaque so long as those elements are not visible to the viewer and occupy a small fraction of the area of the transparent light field display device 100.

The microlens array 140 may be fabricated in a suitable transparent material using photolithographic techniques. The thickness of the transparent material is configured such that the array of light emitting elements 120 (or the array of wavelength conversion elements 150 when present) is located in the focal plane of the microlens array 140. There need not be a one-to-one correspondence between light emitting elements and lens elements in the microlens array. Typically, each lens element may span multiple light emitting elements or multiple RGB pixels. The size of each lens elements and the number of pixels under each lens element is not limited and can be scaled for specific applications.

Although the microlens array 140 is fabricated in a transparent material, it is not, in isolation, transparent because the microlens elements diffract and effectively scatter transmitted light such that a scene cannot be viewed through the microlens array 140.

Figure 2:
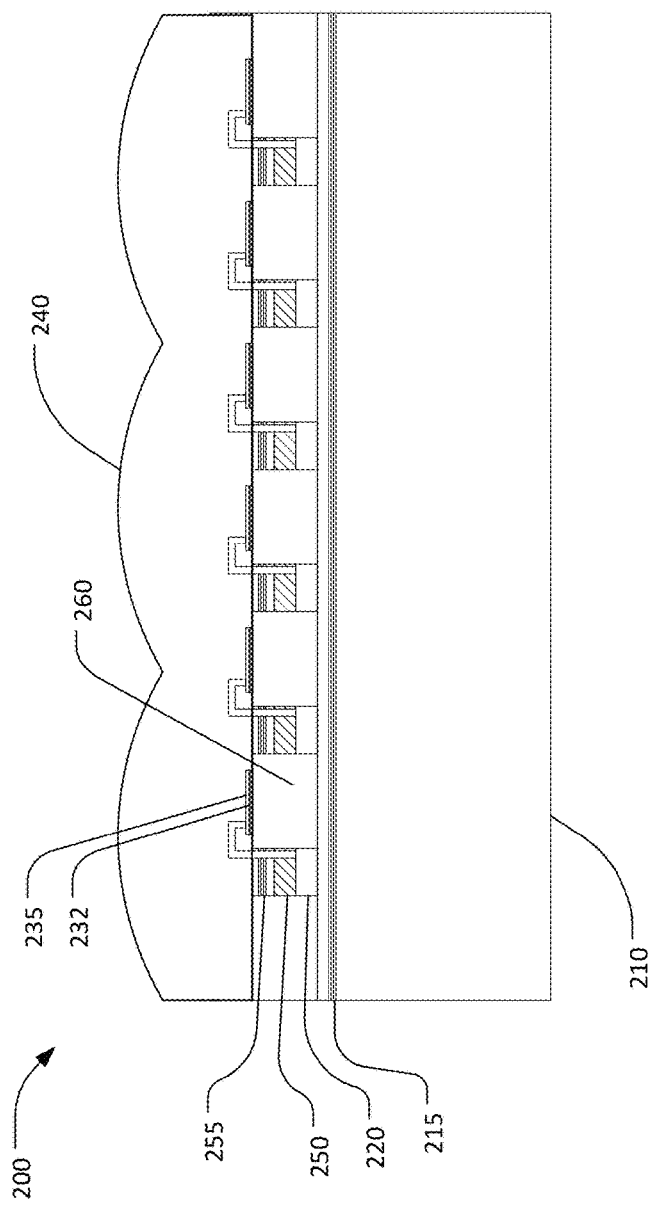
FIG. 2 is a schematic cross-sectional view of another microlens light field display device.

FIG. 2 is a schematic cross-sectional view of another microlens light field display 200. The microlens light field display 100 includes a transparent substrate 210, an array of light emitting elements 220, and array of wavelength conversion elements 250, and a microlens array 240. The array of light emitting elements 220 may be GaN light emitting diodes or other elements that emit violet or ultraviolet light. The array of wavelength conversion elements 250 may absorb the violet or ultraviolet light and emit visible light. The array of wavelength conversion elements 250 may include three different types of elements to convert the emissions from the array of light emitting elements 220 into red, green, and blue primary colors.

There may be a 1:1 correspondence between elements in the array of light emitting elements 220 and the array of wavelength conversion elements. Each light emitting element 220 and the corresponding wavelength conversion element 250 may be sandwiched between a lower distributed Bragg reflector 215 and an upper distributed Bragg reflector 255. The terms "lower" and "upper" refer to position with respect to the substrate 210. The lower distributed Bragg reflector 215 may be formed on, or immediately proximate, the substrate 210, and the upper distributed Bragg reflector 255 may be formed on top of the wavelength conversion elements 250. Both the lower distributed Bragg reflector 215 and the upper distributed Bragg reflector 255 are configured to reflect the violet or ultraviolet emissions from the array of light emitting elements 220, while being transparent to the visible light emitted by the wavelength conversion elements 250.

GaN regions 260 between elements of the array of light emitting elements 250 may be treated by ion implantation, for example but not limited to H, He, N, F, Mg, Ar, Al ion, to create insulating regions to electrically isolate the light emitting elements. Etching based LED isolation creates defects on the side wall and leads to leaking path due to none radiative electron and hole recombination, which reduces the LED efficiency, reduces lifetime/yield and causes self-heating. Ion implantation can convert GaN into high resistance material or insulator without creating leaking paths. Image sensor elements 235 and drive circuits (not shown) may be fabricated in a semiconductor layer over the insulating GaN regions 260. Each image sensor element 235 may include a light blocking layer 232 such that each image sensor element only receives light through the microlens array 240 (i.e. light reflected from a viewer's eye).

Figure 3:
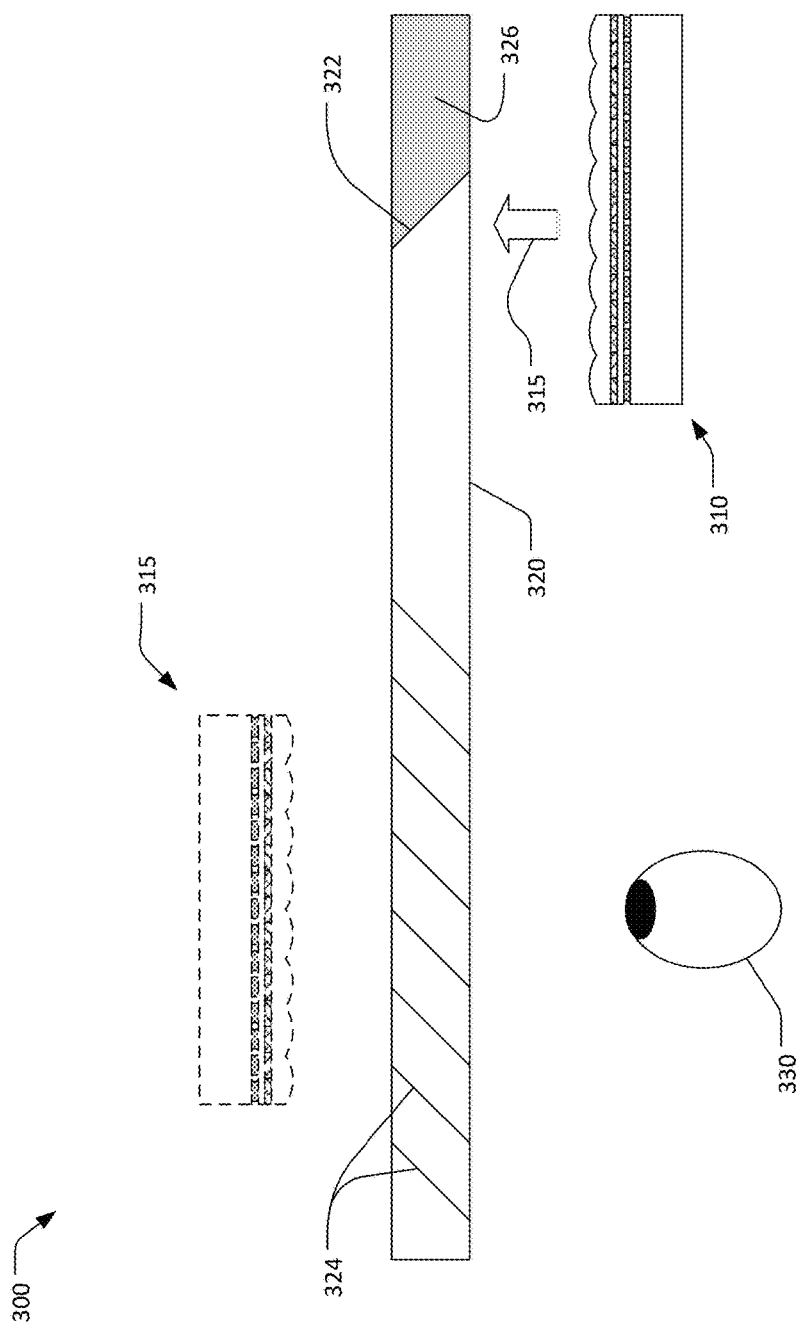
FIG. 3 is a schematic cross-sectional view of a wearable see-through light field display.

FIG. 3 is a schematic cross-section view of a wearable see-through light field display 300. The wearable see-through light field display 300 includes a light field display device 310, which may be the light field display device 100 or 200, and a light guide 320.

The light field display device 310 generates an image in the form of a light field 315. A reflective surface 322 reflects the light field 315 into the light guide 320. The reflective surface 322 may be a metallic or dielectric layer within the light guide 320, or may a prism face form one the light guide 320, in which case the shaded material 326 will not be present. The light guide 320 is formed from a transparent material, which may be, for example, glass, sapphire, quartz, or polymer. Multiple partially reflective surfaces 324 within the light guide 320 reflect portions of the light field towards a viewer's eye 330. Each of the partially reflective surfaces 324 may be, for example, a thin film of a transparent material having a refractive index that is either lower or higher than a refractive index of the light guide 320.

The viewer perceives the light field as if it was generated by a virtual light field display 315 positioned in the viewer's line of sight. Since the virtual image of the light field display is projected beyond the light guide 320, a distance from the viewer's eye 330 to the light guide 320 may be less than a minimum accommodation distance. Since the light field display can generate images at desired focal distance, the distance from viewer's eye 330 to the virtual image of the light field display may be less than the minimum accommodation distance.

Figures 4A, 4B:
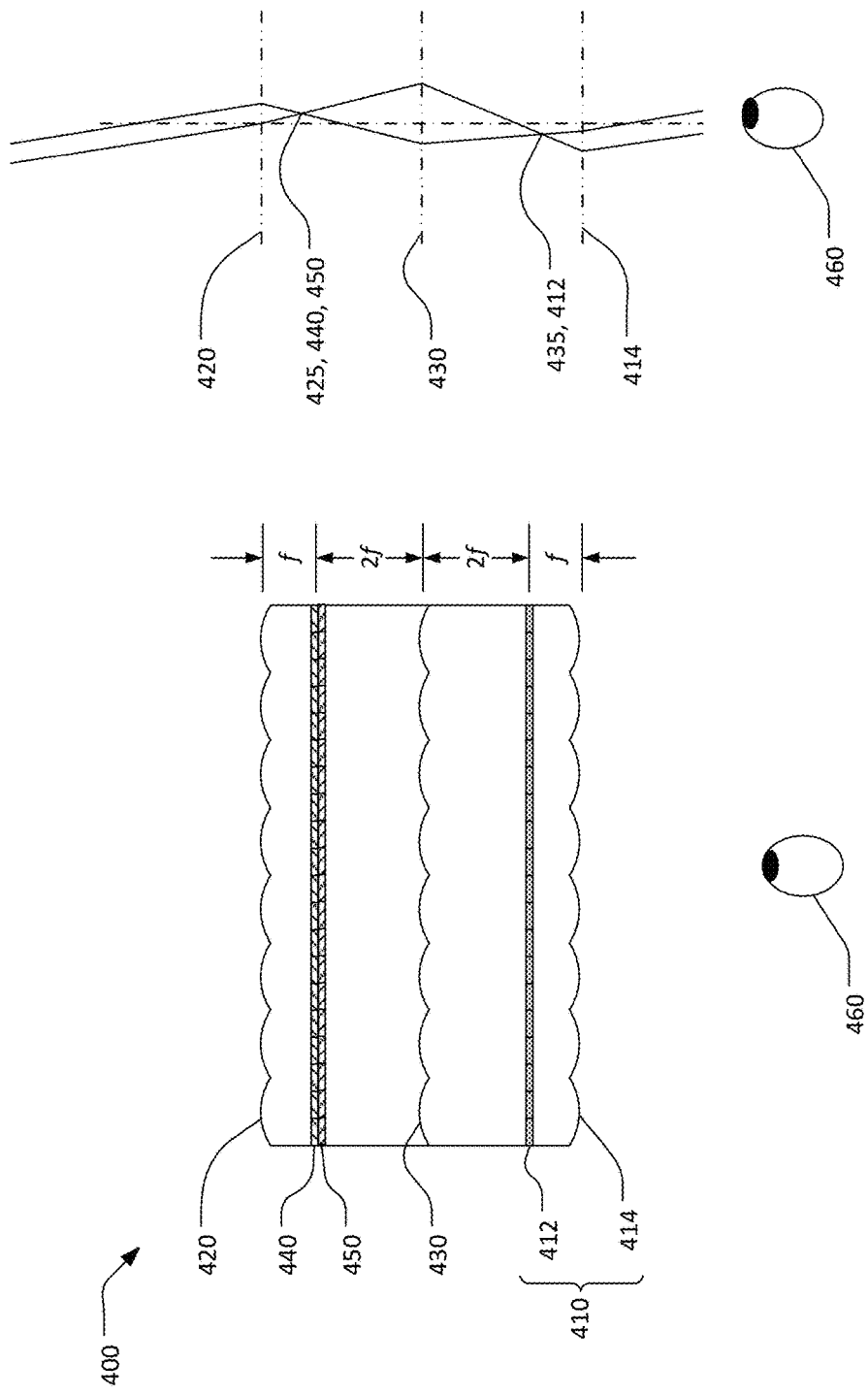
FIG. 4A is a schematic cross-sectional view of a see-through light field display and camera system.
FIG. 4B is a diagram showing paths of exemplary light rays through the see-through light field display and camera system of FIG. 4A.

FIG. 4A is a schematic cross-sectional view of another wearable see-though light field display and camera system 400 including a light field display device 410, which may be the transparent light field display device 100 or 200. The light field display device 410 comprises an array of picture elements 412 (light emitting elements, drive circuitry, and wavelength conversion elements, if used) and a microlens array 414. A spacing between the array of picture elements 412 and the microlens array 414 is equal to the focal length f of the microlens array such that the array of picture elements 412 lies in the focal plane of the micro lens array 414. The microlens array 414 may be densely populated with microlenses.

The microlens array 414 faces a viewer's eye 450. As previously described, it is not possible to view an external scene directly through a dense microlens array since the microlenses refract light received from the scene in different directions. The see-though light field display 400 resolves this problem by incorporating the light field display device 410 into a unity magnification telescope formed by the microlens array 414, a second microlens array 420 and a third microlens array 430 disposed between the light field display device 410 and the second microlens array 420.

An array of detector elements 440 and/or an array of shutter elements 450 may be located between the second microlens array 420 and the third microlens array 430. The array of shutter elements 450 may be, for example, an active matrix liquid crystal display device. The array of shutter elements 450 may serve to occult portions of the outside scene that will be occupied by images formed by the light field display 410. A spacing between the array of picture elements 412 and the microlens array 414 is equal to the focal length f of the second microlens array 420 such that the array detector elements 440 and/or an array of shutter elements 450 lie in the focal plane of the second micro lens array 420.

FIG. 4B is a diagram showing paths of exemplary light rays through the see-through light field display and camera system of FIG. 4A. The second microlens array 420 functions as the objective lens of the telescope. The second microlens array 420 forms an image of the scene at a first focal plane 425. The array of detector elements 440 and/or the array of shutter elements 450 may be disposed at the first focal plane 425, with the array of detector elements 440 and the second microlens array 420 forming a camera for recording the scene. The third microlens array 430 serves as an image-erecting unity magnification relay lens. The third microlens array 430 forms an inverted image of the first focal plane 425 at a second focal plane 435, which is the location of the array of picture elements 412. The distances between the third microlens array and each of the first and second image planes is 2f. The microlens array 414 within the light field display device 410 serves as the eye lens of the telescope to project the image at the second focal plane to the viewer's eye 460.

Figure 5:
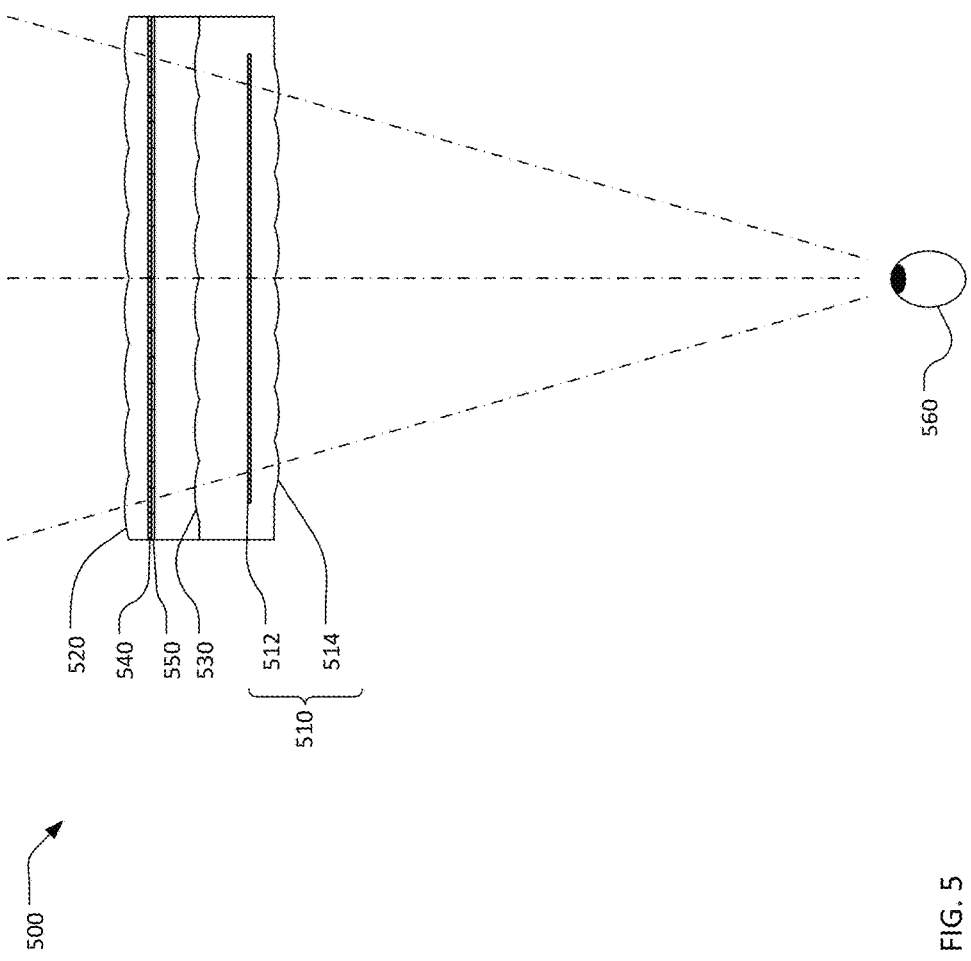
FIG. 5 is a schematic cross-sectional view of a variation of the see-through light field display and camera system of FIG. 4A.

FIG. 5 is a schematic cross-sectional view of another embodiment of a wearable see-though light field display and camera system 500. The see-though light field display and camera system 500 includes a light field display device 510, a second microlens array 520, a third microlens array 530, detector array 540 and a shutter array 550. The function of, and spacing between, these elements is the same as the comparable elements of the see-though light field display and camera system 300. The three microlens arrays 514, 520, 530 are scaled differently to compensate for the angle difference across the scene.

Figure 6:
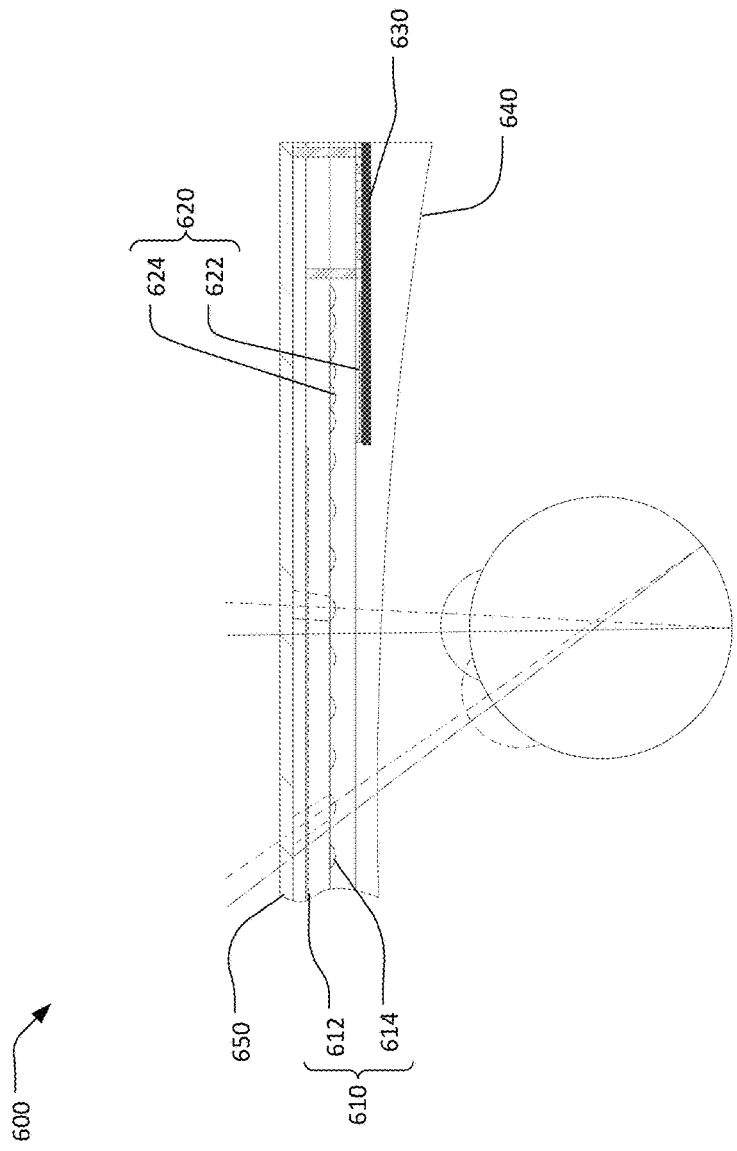
FIG. 6 is a schematic cross-sectional view of a see-through system-on-lens device including a light field display and a light field camera.

FIG. 6 shows a see-through system-on-lens (SOL) device 600 including a transparent light field display 610 to provide an image superimposed over an external scene and a light field camera 620 to capture the external scene. The transparent light field display 610 includes an array of picture elements 612 (light emitting elements, drive circuits, and wavelength conversion elements if used) and a sparse microlens array 614. The array of picture elements 612 may include image sensor elements for wearer authentication and eye position detection as previously described. In contrast to the light field display 100 of FIG. 1, the light field display 610 utilizes a sparse microlens array 614 with space between adjacent lens elements. A viewer perceives the light field generated by the light field display 610, but can also see the outside scene through the spaces between the lens elements. Thus the light field display 610 is transparent.

The light field camera 620 includes an image sensor 622 and a second microlens array 624. The second microlens array 624 may be a dense array of lens elements disposed adjacent to, and coplanar with, the sparse microlens array 614. The second microlens array 624 and the sparse microlens array 614 may be formed concurrently using the same processes and materials.

The see-through SOL device 600 may include other elements in addition to the light field display 610 and light field camera 620. In particular, the image sensor 622 may be a portion of a silicon integrated circuit 630 that contains, for example, motion sensors and/or a wireless data transceiver. The silicon integrated circuit 630 may also contain a wireless power receiver coupled to an antenna (not shown) formed around a perimeter of the SOL device. A corrective lens 640 may be bonded or otherwise fused to the SOL device to correct myopia or hyperopia. A transparent thin film solar cell 650 may be disposed on the outer surface of the SOL device 600 to provide additional electrical power when the SOL device is used in bright ambient lighting conditions. Other elements that may be integrated with the see-through SOL device 600 include additional sensors such as a LIDAR for mapping the outside scene and audio components including earphones and a microphone.

Figure 7:
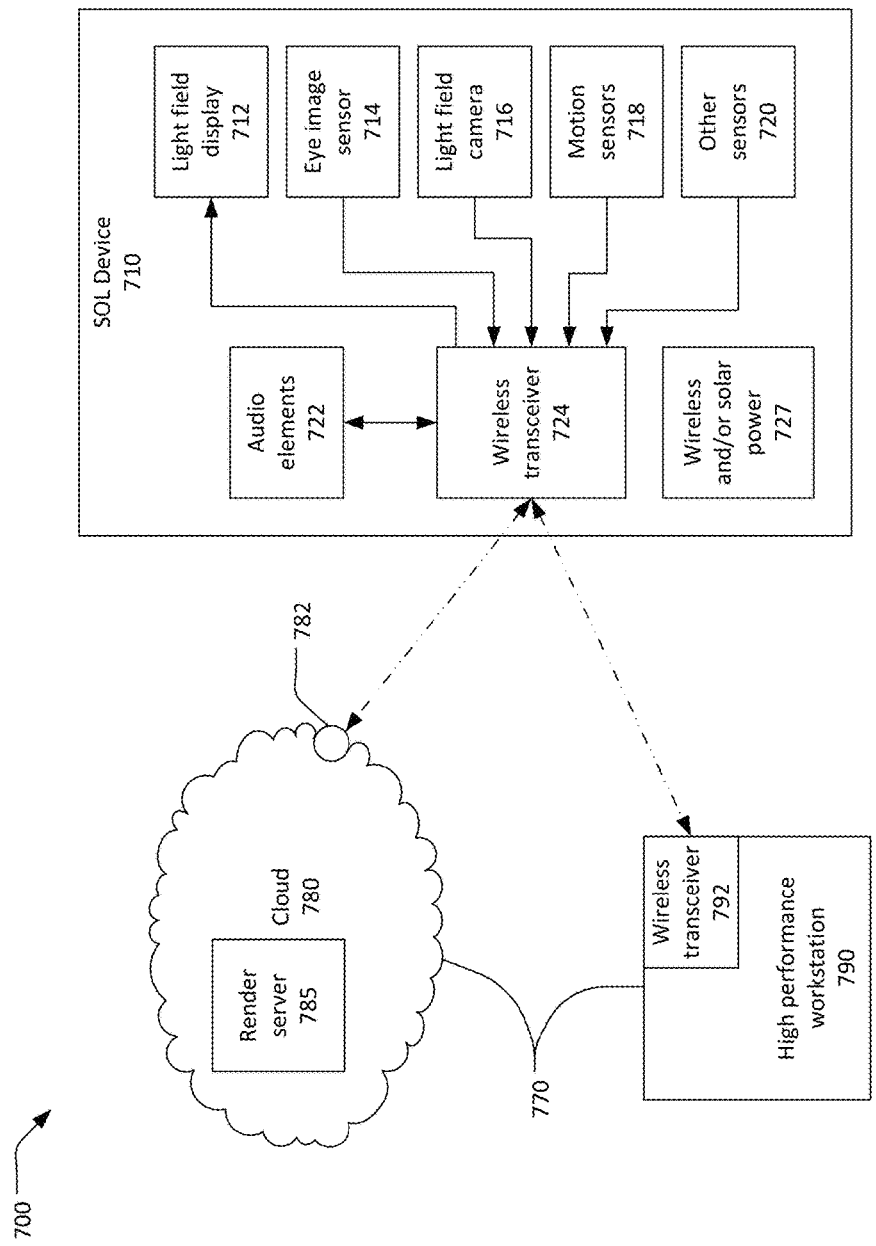
FIG. 7 is a block diagram of a system including a system-on-lens device.

FIG. 7 is a block diagram of an augmented reality system 700 which includes a system-on-lens (SOL) device 710 and a rendering engine 750 to generate images for display on the SOL device 710. The SOL device may be the see-through SOL device 600. The rendering engine 750 may be, for example, an image render server 785 within the cloud 780, or a high-performance workstation 790.

The SOL device 710 includes some or all of a light field display 712, an eye image sensor 714, a light field camera 716 to capture an external scene, motion sensors 718, other sensors 710 such as a Lidar to map the external scene, and audio elements 722 such as earphones and/or a microphone. All of these components communicate with the rendering engine 770 via a wireless transceiver 724. The SOL device 710 may also include a solar panel and/or a wireless power receiver, as well as a battery (not shown) to provide power to the other components.

The rendering engine 770 receives data from the eye image sensor 714, the light field camera 716, and the sensors 718, 720. The rendering engine 770 processes this data and data received from other sources and renders images for presentation by the light field display 712.

When the rendering engine 770 is a server 785 with the cloud 780, the wireless transceiver may communicate with the cloud via an access point 782 using a standard communications protocol such as a subpart of the IEEE 802.11 standard. The system 700 is not limited to IEEE 802.11 and may use any other current or future wireless communications protocol.

When the rendering engine 770 is a local workstation 790 including a wireless transceiver 792, the wireless transceiver 724 may communicate with the workstation using a standard or proprietary wireless communications protocol. Alternatively, the wireless transceivers 724, 792 may be replaced by transceivers for optic fiber or electrical cables (not shown). The use of optical or electrical communications (as opposed to wireless communications) may provide higher communications bandwidth at the expense of a tether between the local workstation 790 and the SOL device 710.

FIG. 8A and FIG. 8B are schematic front and sides views, respectively, of an embodiment of a see-through SOL device 800, which may be the SOL device 810. The see-through SOL device 800 includes two flat display elements 810L, 810R which may be mounted in a frame comparable to a conventional eyeglass frame (not shown). Each of the flat display elements 810L, 810R includes a transparent light field display such as the transparent light field display 610 and eye image sensor elements. Other elements of the SOL device 800, including some or all of a wireless transceiver, a light field camera, motion sensors, other sensors, wireless power receiver, and/or a solar panel, may be included in one or both of the flat display elements 810L, 810R, or may be distributed between the flat display elements 810L, 810R. Some elements of the SOL device 800, such as a battery or audio components, may be disposed on or within the frame (not shown).

FIG. 8C shows an expanded schematic top view of one of the flat display elements 810L, 810R for two different positions of a viewer's eye 820A, 820B. In the left portion of the FIG. 8C, the viewers eye 820A is deeply set and relatively far from the flat display element 810L/R. In this case the marginal pixel 815A of the light field display is disposed at an angle ΘA with respect to the normal to the flat display element. The marginal pixel 815A is superimposed over a corresponding portion of the outside scene. In the right portion of the FIG. 8C, the viewers eye 820A is relatively close to the flat display element 810L/R. In this case the marginal pixel 815B of the light field display is disposed at an angle ΘB with respect to the normal to the flat display element, where ΘB is greater than ΘA. The net result is that the marginal pixels 815A and 815B are superimposed over different portions of the outside scene. Thus the images presented on the light field displays must be rendered differently depending on the depth of the viewers' eyes behind the flat display elements 810L/R. Although not shown, the images presented on the light field displays must be rendered differently depending on the interocular distance between the viewers' eyes, which effects the lateral position of the eyes relative to the flat display elements 810L/R.

As previously described, image sensing elements may be embedded in some or all of the pixels of the light field displays. These image sensing elements detect light reflected from the viewer's eyes which, in turn, allows the rendering engine to determine the positions of the viewer's eyes in three axes and render the displayed images appropriately.

FIG. 9A and FIG. 9B are schematic front and sides views, respectively, of another embodiment of a see-through SOL device 900, which may be the SOL device 710. The see-through SOL device 900 includes a single cylindrical display element 910 which may be mounted in a frame (not shown). The cylindrical display element 910 includes a transparent light field display such as the transparent light field display 610 and eye image sensor elements within the fields of view of both of the wearer's eyes. Other elements of the SOL device 900, including some or all of a wireless transceiver, a light field camera, motion sensors, other sensors, wireless power receiver, and/or a solar panel, may be disposed to the left or right side of the transparent light field display, or may be distributed around a perimeter of the light field display.

FIG. 9C shows an expanded schematic top view of a portion of the cylindrical display element 910 in relation to the position of a viewer's eye 920. The use of a cylindrical display element 910 may provide a wider field-of-view than is possible with the flat display elements shown previously. The cylindrical display element 910 includes an array of display pixels 912 (light emitting elements, drive circuits, wavelength conversion elements if used), and a sparse microlens array 914. The outside scene is viewed through the spaces between the lens element in the sparse microlens array, as represented by the dash-dot arrows.

As previously described, the position of the viewer's eyes effects how images should be rendered for presentation on the see-through SOL device 900. Image sensing elements embedded in some or all of the pixels of the array of display pixels 912 detect light reflected from the viewer's eyes which, in turn, allows the rendering engine to determine the positions of the viewer's eyes in three axes and render the displayed images appropriately.

Figure 10:
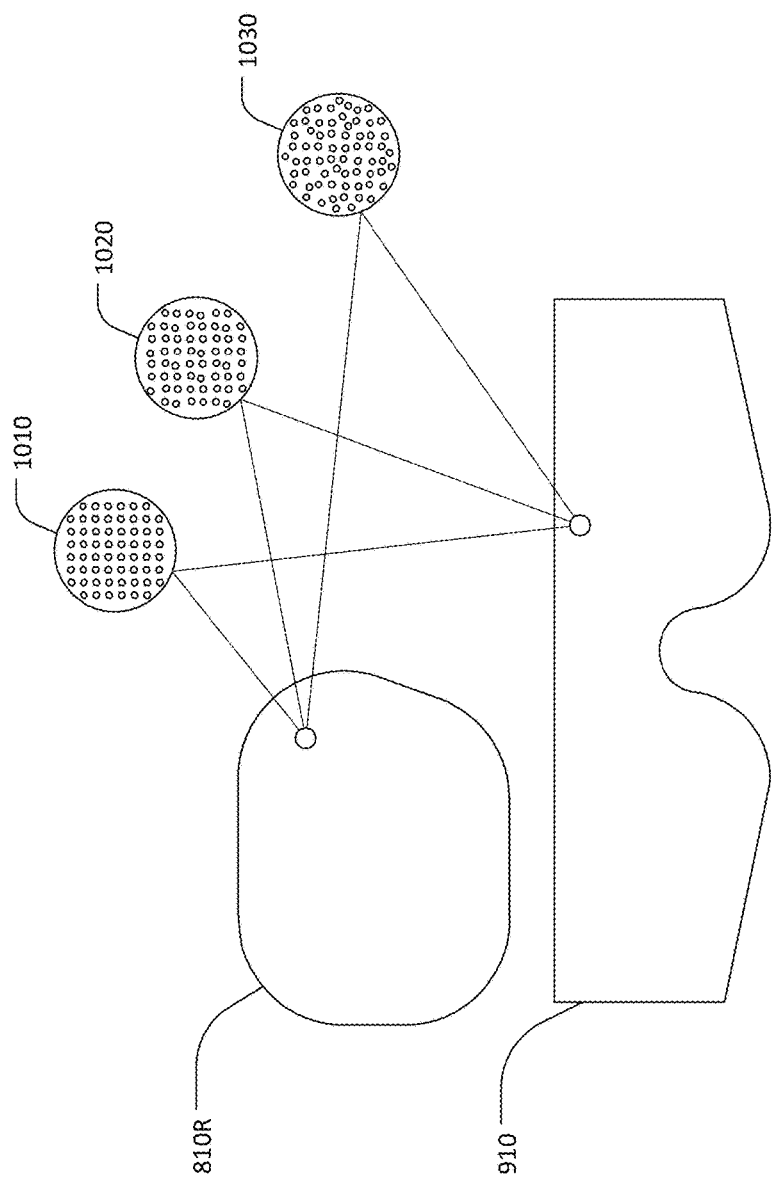
FIG. 10 is a schematic front view of system on lens devices with details showing microlens layouts.

The see-through light field displays of FIG. 6, FIG. 8, and FIG. 9 all included sparse microlens arrays to allow a viewer to see the outside scene through the spaces between the lens elements. However, each lens element will diffract a portion of the light received from the outside scene. Diffraction from multiple, regularly-spaced, lens elements may constructively interfere, forming diffraction orders that appears as halos about objects in the scene. Referring now to FIG. 10, the lens elements of a sparse microlens array may be arranged to minimize diffraction effects.

In FIG. 10, 810R is one of the flat display elements of the SOL system 800 and 910 is the cylindrical display element for the SOL system 900. Both of the display elements 810R and 910 include a sparse microlens array. When the lens elements of the sparse microlens array are arranged in regular rows and columns of a rectangular array, as shown in detail 1010, objectionable diffraction effects may occur. Diffraction effects may be reduced if the lens elements are dithered, or randomly displaced slightly from their respective nominal positions in a rectangular array, as shown in detail 1020. Diffraction effects may be minimized if the lens elements are randomly located, as shown in detail 1020. Note that, in all cases, it is necessary for the rendering engine to know the location of every lens elements in order to properly generate images for display. Thus, the lens elements in detail 1020 and the lens elements in detail 1030 may be pseudo-randomly dithered or placed in accordance with a known function that captures the benefits of true random placement while allowing the rendering engine to determine a position for each lens element.

Description of Processes

Figure 11:
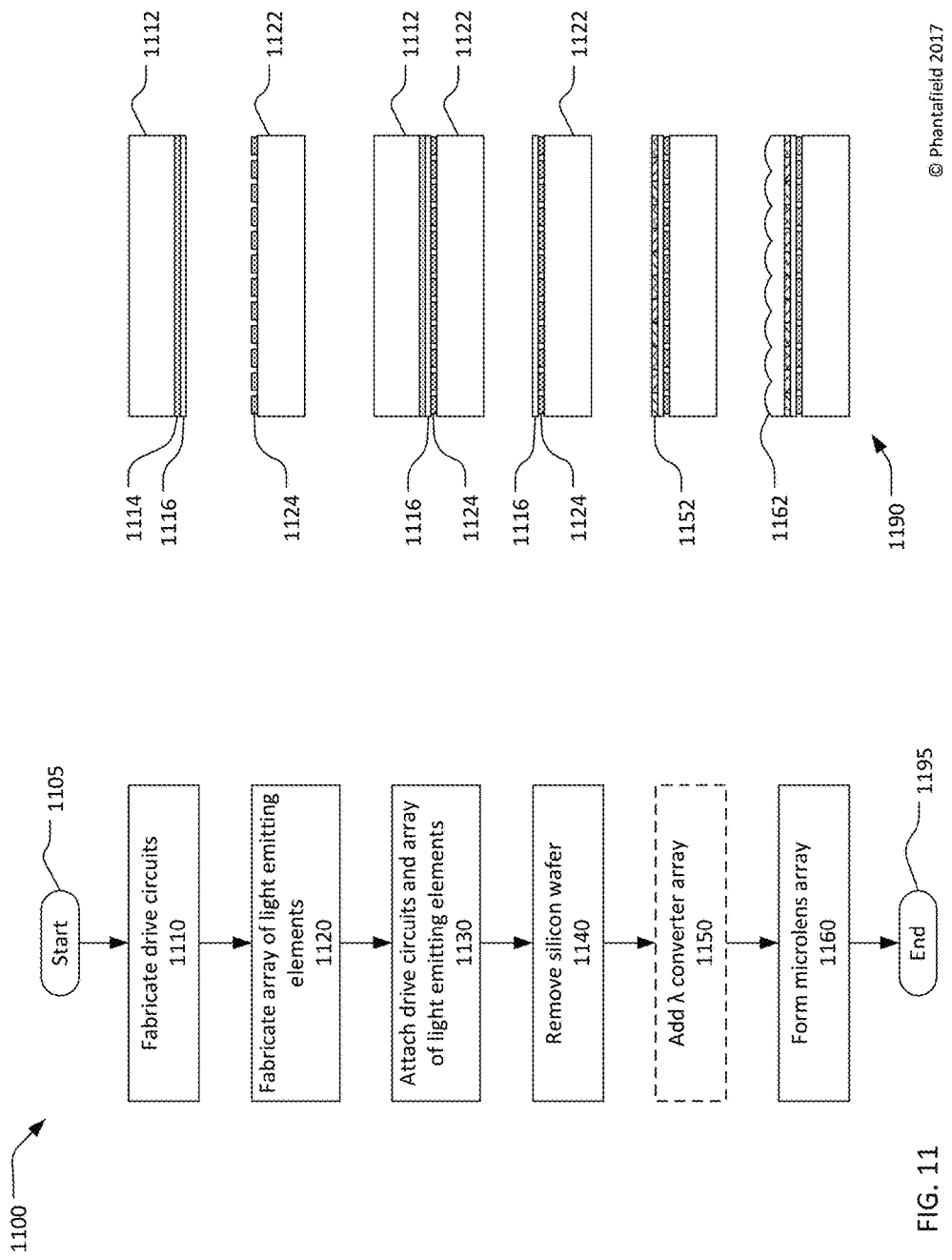
FIG. 11 is a flow chart of a process for assembling a light field display device.

FIG. 11 is flow chart of a process 1100 for assembling a light field display device 1190. The process 1100 begins at 1105 and ends at 1195. Adjacent to each step in the flow chart is a schematic cross-sectional view of a portion of the light field display device at the conclusion of the corresponding process step.

At 1110, drive circuits are fabricated on an SOI wafer comprising a thin silicon film separated from a silicon wafer 1112 by an intervening insulator layer 1114. An array of image sensing elements may be interleaved with the drive circuits. The drive circuits 1116 may be fabricated using conventional semiconductor fabrication processes including selectively doping portions of the thin silicon film and depositing and patterning one or more insulator layer and one or more conductor layer.

At 1120, an array of light emitting elements 1124 is fabricated on a transparent substrate 1122. The light emitting elements may be, for example, GaN light emitting diodes, in which case the transparent substrate 1122 may be a sapphire or GaN wafer. The process 1100 is not limited to GaN light emitting diodes and some other type of light emitting elements and transparent substrate may be used. Note that the steps 1110 and 1120 may be performed concurrently or in either order.

At 1130, the drive circuits 1116 and the array of light emitting elements 1124 may be physical and electrically attached. The attachment may be accomplished, for example, by a combination of heat and pressure. Other methods of attachment may be used.

At 1140, the silicon wafer 1112 and the intervening insulator layer 1124 may be removed. For example, the intervening insulator layer 1124 may be removed by chemical etch to separate the silicon wafer 1112. After removal, the drive electronics 1116 remain connected to the array of light emitting diodes 1124 on the transparent substrate 1122.

When the array of light emitting elements 1124 comprises GaN light emitting diodes, an array of wavelength conversion elements 1152 may be formed over the drive circuits 1116 at 1150. The array of wavelength conversion elements 1152 convert the blue or violet emission from the GaN LEDs into one or more visible colors. Each element in the array of wavelength conversion elements 1152 may be a fluorescent material that absorbs blur or violet radiation from a corresponding element of the array of light emitting elements 1124, and emits one of the three primary colors. The array of wavelength conversion elements 1152 may include three different fluorescent materials interleaved to form red/green/blue (RGB) pixels to provide a full color display. The fluorescent material(s) may be deposited over the drive circuits 1116 by spin coating or other deposition process and then patterned photolithographically.

At 1160, the light field display device 1190 is completed by forming a microlens array 1162 over the array of wavelength conversion elements 1152, if present, or the drive circuits 1116. The microlens array 1162 may be formed by molding, casting, or embossing a transparent polymer material in situ. The microlens array 1152 made be formed by applying (for example, by spin coating) a transparent liquid photopolymer material and then using 3D lithographic techniques to shape the lens elements. The microlens array 1152 may be formed using any known or future process for fabricating microlens arrays.

Figure 12:
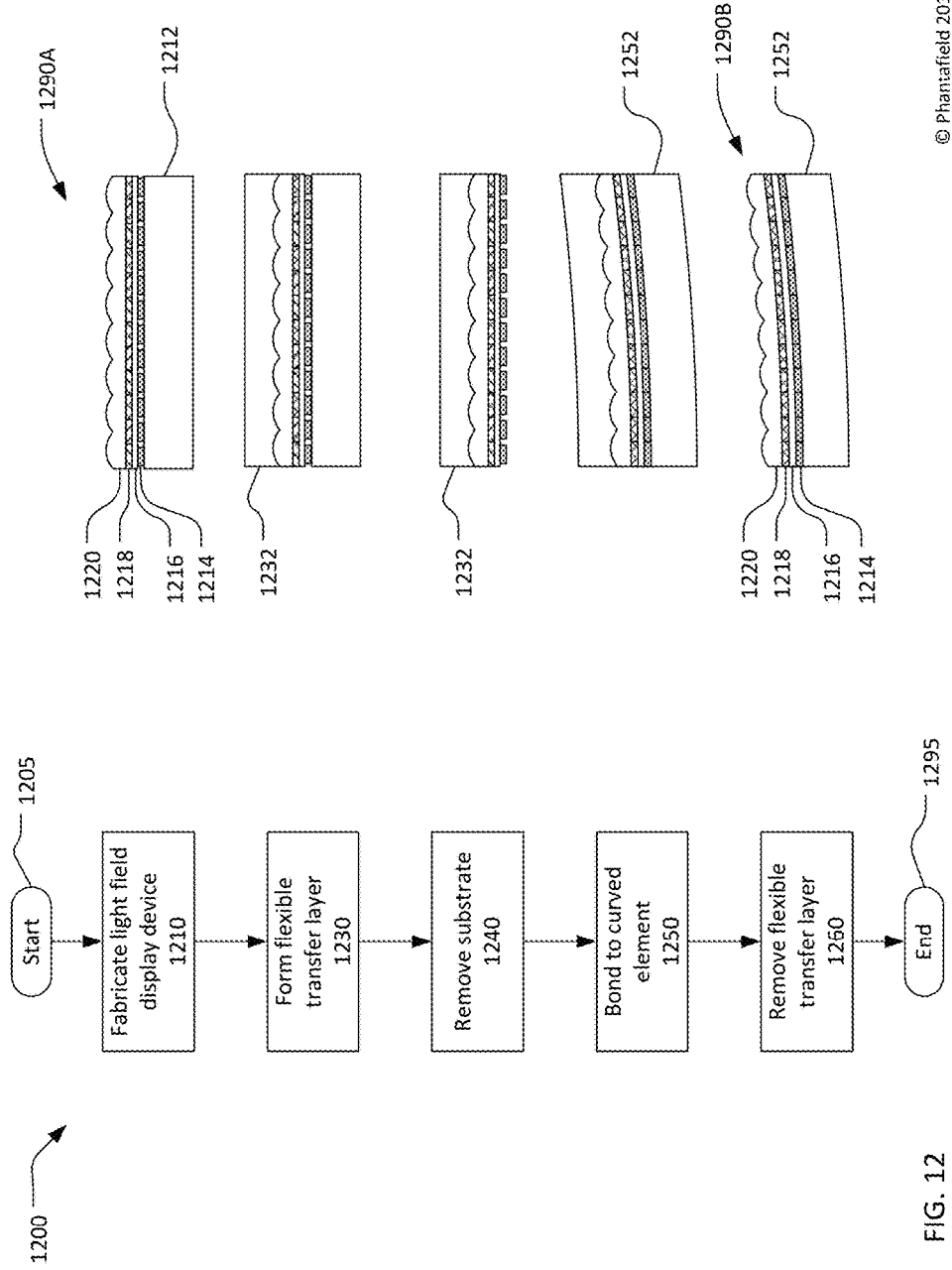
FIG. 12 is a flow chart of a process for transferring a light field display device to a cylindrical substrate.

FIG. 12 is flow chart of a process 1200 for transferring a light field display device to a cylindrical substrate. The process 1200 begins at 1205 and ends at 1295. The process 1200 may be suitable for fabrication of the see-through SOL device 900. Adjacent to each step in the flow chart is a schematic cross-sectional view of a portion of the light field display device at the conclusion of the corresponding process step.

At 1210, a light field display device 1290A is fabricated on a rigid substrate 1212. The light field display device 1290A may typically include an array of light emitting element 1214, drive circuits 1216, and optional array of wavelength conversion elements 1218, and a microlens array 1220. The light field display device 1290A may be fabricated, for example, using the process 1000, or another suitable process.

At 1230, a thick flexible transfer layer 1232 may be formed over the microlens array. The flexible transfer layer may be formed by casting or molding in situ, or by depositing and curing a liquid polymer material such as poly(methyl methacrylate).

At 1240 the transparent substrate is removed, leaving the elements of the light field display supported only by the flexible transfer layer. The thickness and mechanical properties of the flexible transfer layer must retain the elements of the light field display device in place as the transparent substrate is removed. Known techniques may be used to separate the transparent substrate 1212 from the array of light emitting elements 1214. For example, a separation layer, such as a layer of a chemically reactive material, may be formed on the substrate 1212 prior to forming the array of light emitting elements 1214. The separation layer may then be selectively etched to separate the substrate. For further example, a separation layer of graphene may be deposited on a sapphire substrate before formation of an array of GaN light emitting elements. The substrate may then be separated by mechanical force. Alternatively, a separation layer may be formed by focused laser annealing to create a thin layer of metallic gallium at the interface between the substrate 1212 and an array of GaN light emitting elements 1214. The gallium layer may then be selectively etched to separate the substrate. In all cases, a mechanical polish of the exposed surface of the array of light emitting elements may be required.

At 1250, the assembly (flexible transfer layer 1232, microlens array 1220, array of wavelength conversion elements 1218, drive circuits 1216, and array of light emitting elements 1214) are curved and bonded to a cylindrical substrate 1252). Alternatively, the assembly may be bonded to a flat moldable substrate and later curved to desired shape. At 1260, the light field display device 1290B is completed by removing the flexible transfer layer 1252 using a selective solvent or other process. Except for the cylindrical curvature of the substrate 1252, the light field display 1290B is functionally equivalent to the light field display device 1290A.

Figure 13:
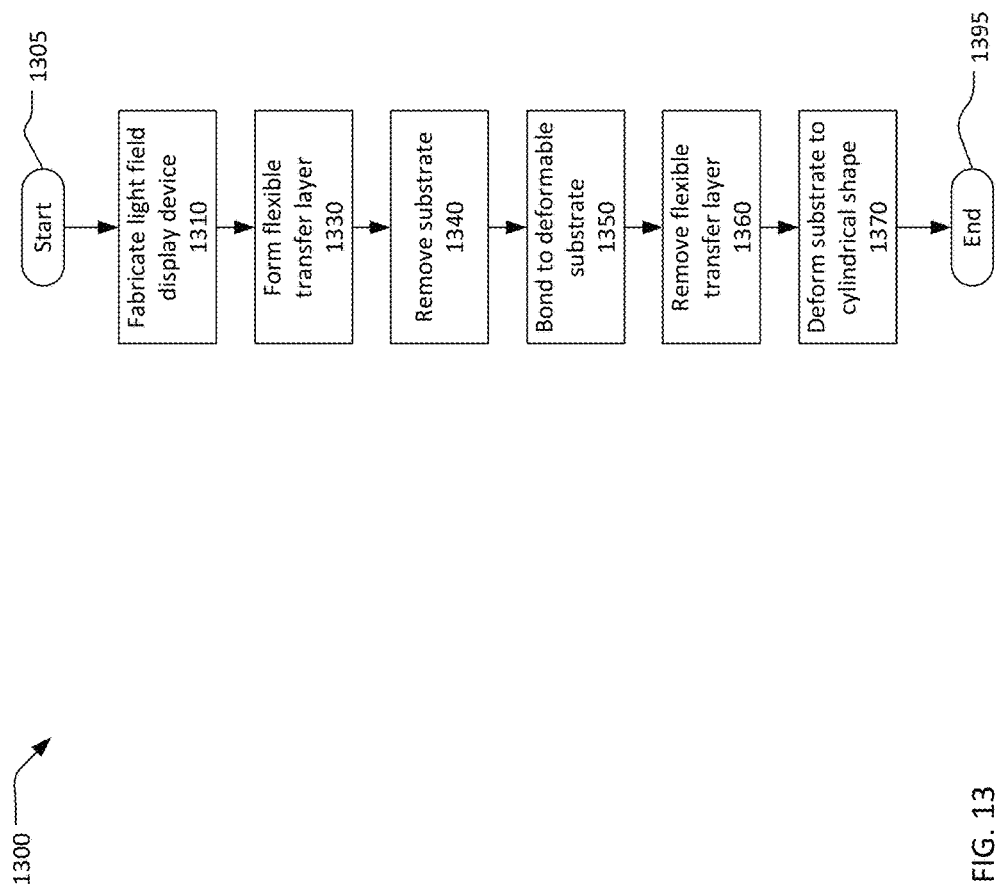
FIG. 13 is a flow chart of another process for transferring a light field display device to a cylindrical substrate.

FIG. 13 is flow chart of another process 1300 for transferring a light field display device to a cylindrical substrate. The process 1300 begins at 1305 and ends at 1395. The process 1300 may be suitable for fabrication of the see-through SOL device 900.

The actions at 1310, 1330, and 1340 are the same as the counterpart actions in the process 1200. Descriptions of these actions will not be repeated.

At 1350, the assembly from 1340 (flexible transfer layer, microlens array, array of wavelength conversion elements, drive circuits, and array of light emitting elements) are bonded to a deformable substrate. The deformable substrate may be a plastic material that can be permanently deformed, for example through the application of heat and pressure. At 1360, the flexible transfer layer may be removed using a selective solvent or other process. The deformable substrate is then deformed into a cylindrical shape at 1370, resulting in a completed display device essentially the same as the display device 1290B, as shown in FIG. 12. The actions at 1360 and 1370 may be performed in reverse order, such that the flexible transfer layer is removed after the deformable substrate is deformed.

Figure 14:
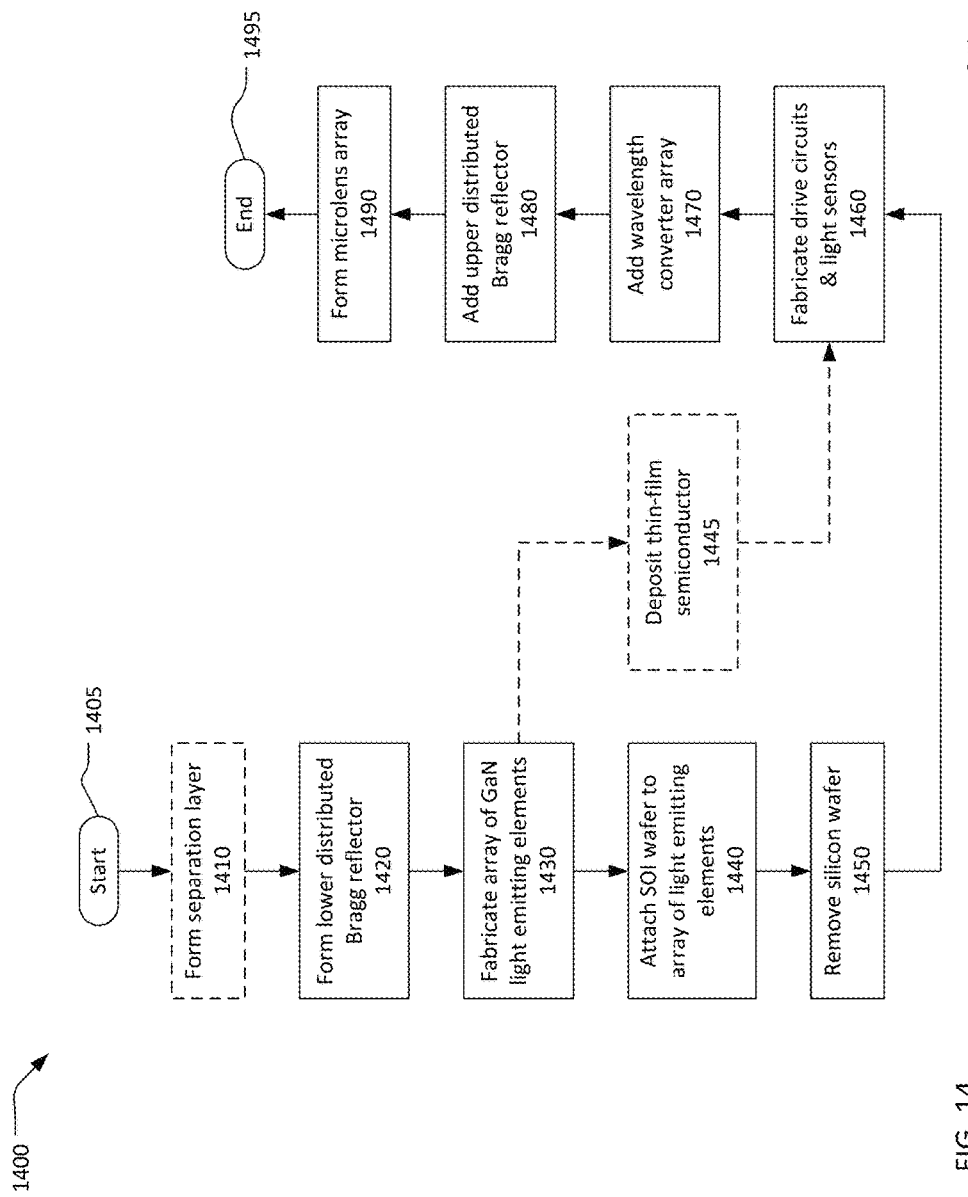
FIG. 14 is a flow chart of another process for assembling a light field display device.

FIG. 14 is flow chart of another process 1400 for assembling a light field display device, which may be the light field display device 200. The process 1400 begins at 1405 and ends at 1495.

At 1410, an optional separation layer, as previously described, may be formed on a substrate. The release layer may be used if the completed light field display will be separated from the substrate and transferred to a curved substrate using a process such as the process 1200 or 1300. If transfer to a curved substrate is not required, the action at 1410 may be omitted.

At 1420, a lower distributed Bragg reflector may be formed on the substrate, or on the separation layer if present. The lower distributed Bragg reflector may typically be formed by alternate deposition of thin layers of two materials having different refractive indices. These materials may be deposited by atomic layer epitaxy, metal-organic chemical vapor deposition, sputtering, evaporation, laser pulse deposition, or other deposition process. The materials and the number and thickness of the layers may be selected such that the lower distributed Bragg reflector reflects the violet or ultraviolet light emitted by GaN light emitting diodes and transmits visible light.

At 1430, an array of GaN light emitting elements is fabricated on top of the lower distributed Bragg reflector. Fabricating the array of GaN light emitting elements may include successive formation of a lower doped GaN layer, a multiple quantum well structure, and an upper doped GaN layer. Fabricating the array of GaN light emitting elements may also include ion implantation of regions between the GaN light emitting elements to provide inter-element isolation.

At 1440, an insulating layer, such as SiO2 (not shown) may be deposited on top of the array of light emitting elements. An SOI wafer may be attached to the top of the insulating layer using a known wafer bonding technique such as plasma assisted thermal pressure or chemical inter-media wafer bonding. An SOI wafer consists of a silicon substrate and a thin single crystal film separated by an intervening insulator layer. At 1440, the SOI wafer is bonded with the thin single crystal silicon film facing the array of light emitting elements. At 1450, the silicon substrate of the SOI wafer may be removed by chemically etching the intervening insulator layer, leaving the thin single crystal silicon layer in place over the array of light emitting elements.

As an alternative to the actions at 1440 and 1450, a thin film semiconductor, such as Indium Gallium Zinc Oxide (IGZO), may be deposited onto the array of light emitting elements at 1445.

At 1460, drive circuits and image sensor elements are fabricated on the thin single crystal silicon film from 1450 or the thin film semiconductor layer from 1445. The drive circuits may be fabricated using conventional semiconductor fabrication processes including selectively doping portions of the thin silicon or semiconductor film and depositing and patterning one or more insulator layer and one or more conductor layer. An array of image sensor elements may be interleaved with the drive circuits. The drive circuits and the array of image sensor elements may be fabricated concurrently or consecutively.

At 1470, an array of wavelength conversion elements may be formed. The array of wavelength conversion elements may be formed over the drive circuits, or may be formed over the light emitting elements (through windows opened in the semiconductor film in which the drive circuits are fabricated). Each element in the array of wavelength conversion elements may be a fluorescent material that absorbs ultra-violet or violet radiation from a corresponding element of the array of light emitting elements, and emits visible light. The fluorescent material(s) may be deposited over the drive circuits by spin coating or other deposition process and then patterned photolithographically.

At 1480, upper distributed Bragg reflectors may be formed on top of the elements of the array of wavelength converting elements. The upper distributed Bragg reflectors may be configured to reflect the violet or ultra-violet light emitted by GaN light emitting diodes and to transmit the visible light emitted by the wavelength conversion elements.

At 1490, the light field display device is completed by forming a microlens array over the other elements of the light field display device. The microlens array may be formed by molding, casting, or embossing a transparent polymer material in situ. The microlens array made be formed by applying (for example, by spin coating) a transparent liquid photopolymer material and then using 3D lithographic techniques to shape the lens elements. The microlens array may be formed using any known or future process for fabricating microlens arrays.

Closing Comments

Throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. With regard to flowcharts, additional and fewer steps may be taken, and the steps as shown may be combined or further refined to achieve the methods described herein. Acts, elements and features discussed only in connection with one embodiment are not intended to be excluded from a similar role in other embodiments.

As used herein, "plurality" means two or more. As used herein, a "set" of items may include one or more of such items. As used herein, whether in the written description or the claims, the terms "comprising", "including", "carrying", "having", "containing", "involving", and the like are to be understood to be open-ended, i.e., to mean including but not limited to. Only the transitional phrases "consisting of" and "consisting essentially of", respectively, are closed or semi-closed transitional phrases with respect to claims. Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements. As used herein, "and/or" means that the listed items are alternatives, but the alternatives also include any combination of the listed items.

It is claimed:

1. A see-through system-on-lens (SOL) device, comprising:
   a transparent light field display device and a light field camera disposed on a common transparent substrate;
   the transparent light field display comprising:
      an array of light-emitting picture elements formed on the transparent substrate; and
      a sparse microlens array formed over the array of light-emitting picture elements, the sparse microlens array comprising a plurality of lens elements with spaces between adjacent lens elements,
      wherein, when the transparent light field display device is disposed with the sparse microlens array proximate a viewer's eye, the spaces between adjacent lens elements allow the viewer to see a scene beyond the transparent light field display device; and
   the light field camera comprising:
      an image sensor; and
      a camera microlens array disposed between the image sensor and the scene,
   wherein the camera microlens array is a dense microlens array, and is disposed adjacent to and coplanar with the sparse microlens array, and
   wherein the array of light-emitting picture elements and the image sensor are on opposite sides of the sparse microlens array and the camera microlens array.

2. The SOL device of claim 1, wherein a position of each of the plurality of lens elements of the sparse microlens array is randomly or pseudo-randomly displaced from a respective nominal position in a rectangular microlens array.

3. The SOL device of claim 1, wherein each of the plurality of lens elements of the sparse microlens array is randomly or pseudo-randomly positioned within the microlens array.

4. The SOL device of claim 1, wherein the transparent substrate is a portion of a cylindrical surface.

5. The SOL device of claim 1, wherein each picture element of the array of light-emitting picture elements comprises:
   one or more light emitting elements; and
   control circuits for the one or more light emitting elements.

6. The SOL device of claim 5, wherein the control circuits comprise a single crystal silicon film transferred from a silicon-on-insulator wafer.

7. The SOL device of claim 5, wherein the control circuits comprise a semiconductor layer deposited over the light emitting elements.

8. The SOL device of claim 5, wherein the one or more light emitting elements are GaN light emitting diodes.

9. The SOL device of claim 8, wherein the control circuits comprise GaN transistors between the GaN light emitting diodes.

10. The SOL device of claim 8, wherein the GaN light emitting diodes are separated by ion implanted insulating regions.

11. The SOL device of claim 8, further comprising:
respective wavelength conversion elements associated with each GaN light emitting diode, the wavelength conversion elements formed over the GaN light emitting diodes.

12. The SOL device of claim 1, wherein each picture element of the array of light-emitting picture elements comprises:
first, second, and third GaN light emitting diodes;
control circuits for the first second and third light emitting diodes; and
respective wavelength conversion elements to convert violet or ultraviolet radiation from the first second and third light emitting diodes into red, green, and blue light, respectively.

13. The SOL device of claim 1, wherein at least a subset of the array of light-emitting picture include image sensor elements to detect light reflected from a viewer's eye and received through the sparse microlens array.

14. The SOL device of claim 1, wherein:
the image sensor is a portion of a silicon integrated circuit chip, and
the silicon integrated circuit chip further comprises a transceiver for communications with a remote rendering engine.

15. The SOL device of claim 14, wherein the transceiver is a wireless transceiver for communicating wirelessly with the remote rendering engine.

16. The SOL device of claim 14, wherein the transceiver is an optical transceiver for communicating with the remote rendering engine via an optical fiber cable.

17. The SOL device of claim 14, wherein the silicon integrated circuit chip further comprises motions sensors.

18. The SOL device of claim 1, further comprising a thin film photovoltaic cell formed on a surface of the substrate facing the scene.

19. The SOL device of claim 1, further comprising a LIDAR (laser imaging and ranging) subsystem for depth mapping the scene.

20. The SOL device of claim 1, further comprising a wireless power antenna and receiver.

* * * * *